(12) United States Patent
Shiratori

(10) Patent No.: US 8,810,129 B2
(45) Date of Patent: Aug. 19, 2014

(54) LIGHT EMITTING DEVICE WITH TRANSMISSIVE FILM PATTERNED IN A STEPWISE SHAPE AND METHOD OF MANUFACTURING THE LIGHT EMITTING DEVICE

(75) Inventor: Koya Shiratori, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 195 days.

(21) Appl. No.: 13/410,926

(22) Filed: Mar. 2, 2012

(65) Prior Publication Data

US 2012/0229014 A1 Sep. 13, 2012

(30) Foreign Application Priority Data

Mar. 7, 2011 (JP) .................................. 2011-049406

(51) Int. Cl.
| | | |
|---|---|---|
| *H01J 1/62* | (2006.01) | |
| *H05B 33/00* | (2006.01) | |
| *H01J 9/00* | (2006.01) | |
| *H01L 51/52* | (2006.01) | |
| *H01L 27/32* | (2006.01) | |

(52) U.S. Cl.
CPC ..... *H01L 51/5265* (2013.01); *H01L 2251/5315* (2013.01); *H01L 27/3216* (2013.01)
USPC .............. 313/506; 313/498; 313/504; 445/58

(58) Field of Classification Search
USPC .................................................. 313/504–506
See application file for complete search history.

(56) References Cited

U.S. PATENT DOCUMENTS

| 5,554,911 | A | 9/1996 | Nakayama et al. |
|---|---|---|---|
| 2005/0140277 | A1* | 6/2005 | Suzuki et al. ................. 313/504 |
| 2007/0015429 | A1* | 1/2007 | Maeda et al. ................... 445/24 |
| 2007/0075305 | A1* | 4/2007 | Miyata et al. ................... 257/13 |
| 2007/0102737 | A1* | 5/2007 | Kashiwabara et al. ....... 257/291 |
| 2009/0033214 | A1* | 2/2009 | Berger et al. ................. 313/504 |
| 2009/0153036 | A1 | 6/2009 | Gonda |
| 2009/0273279 | A1 | 11/2009 | Chino et al. |
| 2010/0096988 | A1 | 4/2010 | Kitabayashi et al. |
| 2010/0117528 | A1 | 5/2010 | Fukuda |
| 2010/0253222 | A1 | 10/2010 | Koshihara |

FOREIGN PATENT DOCUMENTS

| JP | B2-2797883 | 9/1998 |
|---|---|---|
| JP | A-2009-147114 | 7/2009 |
| JP | A-2009-272081 | 11/2009 |
| JP | A-2010-98155 | 4/2010 |
| JP | A-2010-118273 | 5/2010 |
| JP | A-2010-244693 | 10/2010 |

\* cited by examiner

*Primary Examiner* — Sikha Roy
(74) *Attorney, Agent, or Firm* — Oliff PLC

(57) ABSTRACT

On one short side of a rectangular aperture area, transparent conductive films are patterned by being deviated in a stepwise shape. On another side, an end surface of the transparent conductive films is patterned to be aligned. The end surface of the transparent conductive films is covered with an insulating film.

8 Claims, 9 Drawing Sheets

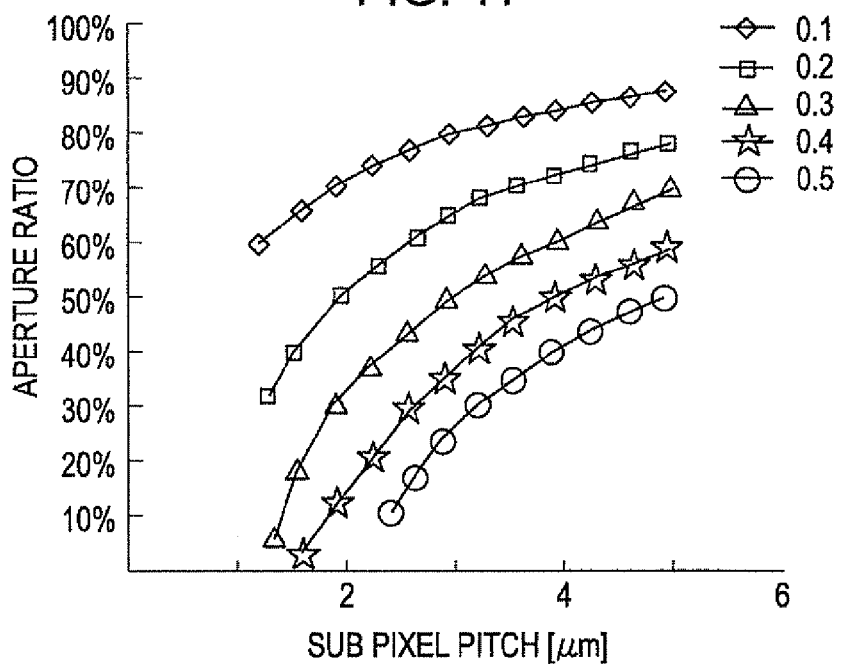
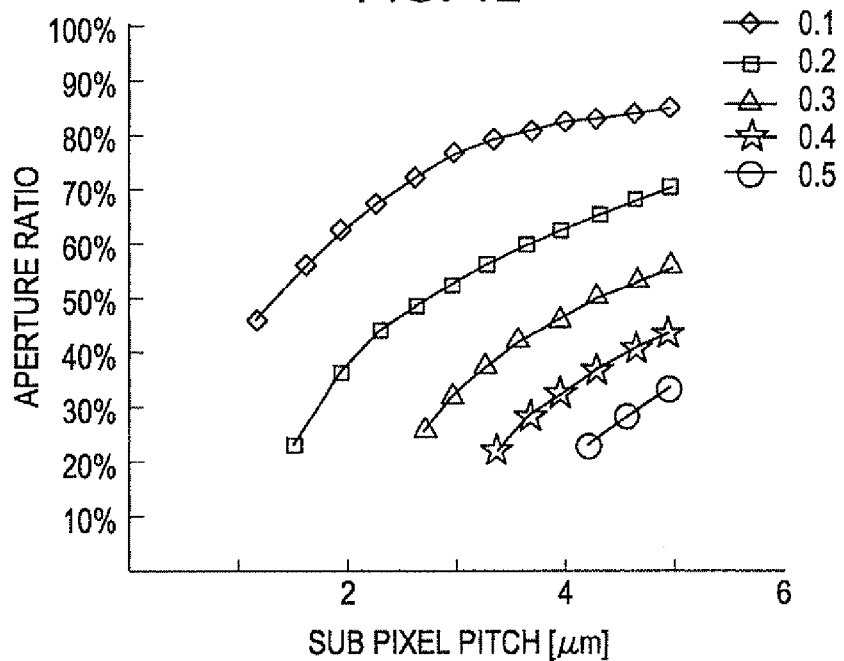

LIGHT EMITTING DEVICE WITH TRANSMISSIVE FILM PATTERNED IN A STEPWISE SHAPE AND METHOD OF MANUFACTURING THE LIGHT EMITTING DEVICE

BACKGROUND

1. Technical Field

The present invention relates to a light emitting device in which various light emitting elements are used, and a method of manufacturing the light emitting device.

2. Related Art

In recent years, a top emission-type light emitting device has been widely used as a display device of an electronic apparatus, which forms an organic EL (electroluminescence) element on a substrate as a light emitting element, and extracts emission light of the light emitting element to the opposite side of the substrate. In the top emission-type, a reflecting layer is formed between a first electrode (for example, an anode) on one side on which the light emitting element is inserted, and which is formed on a substrate side, and the substrate, and light is extracted from a second electrode (for example, a cathode) on another side on which the light emitting is inserted, and of which a light use efficiency is high.

In addition, a technology is disclosed in which, in the top emission-type light emitting device, light with a predetermined wavelength is resonated between the second electrode and the reflecting layer by using a white organic EL element, and light extraction efficiency is increased (for example, Japanese Patent No. 2797883). In this technology, each of the resonant length of red emission light, green emission light, and blue emission light is adjusted in transparent film on the substrate side, or in transparent conductive film as the first electrode.

Accordingly, in this type, a step difference easily occurs around pixels, and a current excessively flows, since the thickness of film of the organic EL element becomes thin around the pixels. Therefore, it is common to form an insulating film which defines the pixels, in order to eliminate the step difference. In addition, if the step difference of the transparent film and the transparent conductive film is excessively high, there have been cases where the step breakage of the organic EL element and the second electrode which is formed on the organic EL element occurs. For this reason, the pattern position of the transparent film or the transparent conductive film is deviated in a stepwise shape, and the step difference is minimized, so as to secure the conduction between the organic EL element and the second electrode.

However, there was a problem in that if the pattern position of the transparent film or the transparent conductive film is deviated in the stepwise shape as described above, and further the insulating film is formed, an aperture area becomes small by the deviation of the pattern position.

SUMMARY

An advantage of some aspects of the invention is to provide a top emission-type light emitting device in which a white organic EL element and a resonant structure are combined, which suppresses a decrease of the aperture area, while preventing a current from excessively flowing in the organic EL element, and the step breakage of the organic EL element and the second electrode.

According to an aspect of the invention, there is provided a light emitting device which includes, a substrate; a light reflecting layer which is formed on the substrate; a transmissive film which is formed on the light reflecting layer; a luminous layer which is formed on the transmissive film; and an electrode which is formed on the luminous layer; a resonant structure in which an optical path length between the light reflecting layer and the electrode is adjusted by the transmissive film; and a rectangular aperture area, wherein the transmissive film is patterned by deviating the position in a stepwise shape on at least one side of the rectangular aperture area, and end surfaces of the transmissive film are patterned so as to be aligned on another side thereof.

In the light emitting device, the transmissive film is patterned by deviating the position in the stepwise shape on at least one side of the rectangle. Accordingly, an excessive current does not flow in the luminous layer, since a step difference of the transmissive film is small, and the thickness of the luminous layer does not become thin. In addition, since the step difference of the transmissive film becomes small, the step breakage of the luminous layer and the electrode does not occur, and the conduction to the electrode is secured. In addition, the end surface of the transmissive film is patterned so as to be aligned on the sides other than the one side. Accordingly, areas which are not related to the emission of light are reduced, and the aperture area is increased.

In the light emitting device, the light reflecting layer and the transmissive film may be provided for each luminous color, and at least one side of the rectangular aperture area on which the transmissive film was patterned by deviating the position thereof in the stepwise shape may also set to the same one side in each luminous color.

In the light emitting device, since at least one side of the rectangle on which the transmissive film was patterned by deviating the position thereof in the stepwise shape is set to the same one side in each luminous color, it is possible to provide a contact hole at the same one side, and it is advantageous when performing a layout.

In the light emitting device, it may be also possible to cover the end portion of the transmissive film with an insulating layer. In this manner, the step difference due to the transmissive film can be reduced, and it may be possible to prevent the excessive current from flowing to the luminous layer, and to suppress the step breakage of the luminous layer and electrode, without reducing the aperture area.

In the light emitting device, it may be possible to cover the transmissive film more in the inner side than the pattern end using the insulating layer. In this manner, it may be possible to reduce the step difference due to the transmissive film, and to prevent the excessive current from flowing to the luminous layer without reducing the aperture area.

In the light emitting device, on the one side of the transmissive film where the transmissive film is patterned by deviating the position thereof in the stepwise shape, it may be possible to cause a driving element which is provided on the substrate side and the electrode to be electrically connected to each other. In this manner, it may be possible to reliably drive the light emitting device while increasing the aperture area.

In the light emitting device, on another side of the transmissive film of which the end surface is patterned to be aligned, it may also be possible to cause the driving element which is provided on the substrate side not to be electrically connected to the electrode. In this manner, it may be possible to increase the aperture area.

In the light emitting device, it may be possible to make the one side of the transmissive film in which the transmissive film is patterned by deviating the position thereof in the stepwise shape shorter than the length of another side in which the end surface of the transmissive film is patterned to be aligned. In this manner, it may be possible to increase the aperture area by reducing areas which are not related to the emission of light as much as possible.

In the light emitting device, it may be also possible to make the transmissive film be patterned by deviating the position thereof in the stepwise shape at two sides which are shorter than the length of the other sides, and face each other. In this manner, it may be possible to reliably drive even a high definition light emitting device without reducing the aperture area.

In the light emitting device, it may be also possible to use a transparent conductive film as the transmissive film. In addition, it may be possible to use the transmissive film as an insulator.

According to another aspect of the invention, there is provided a method of manufacturing a light emitting device which includes, forming a light reflecting layer on a substrate; forming a transmissive film on the light reflecting layer; forming a luminous layer on the transmissive film; forming an electrode on the luminous layer; wherein the light emitting device includes a resonant structure in which an optical path length between the light reflecting layer and the electrode is adjusted by the transmissive film, and is formed with a rectangular aperture area, and wherein the method includes, patterning the transmissive film by deviating a position of the transmissive film in a stepwise shape of at least one side of the rectangle; and patterning the transmissive film so that an end surface of the transmissive film is aligned at another side of the rectangle.

In the light emitting device, the transmissive film is patterned by deviating the position thereof in the stepwise shape, on at least one side of the rectangle. Accordingly, an excessive current does not flow through the luminous layer, since the step difference of the transmissive film becomes small, and the thickness of the luminous layer does not become thin. In addition, it is possible to secure the conduction to the electrode without the step breakage of the luminous layer and the electrode, since the step difference of the transmissive film is small. In addition, the end surface of the transmissive film is patterned to be aligned on a side other than the one side. Accordingly, the region not relating to the light emission is reduced, and it is possible to increase the aperture area.

In the light emitting device, it may be possible to form a contact hole which causes the transparent layer and the driving element to be conducted to each other, on the one side of the transmissive film in which the transmissive film is patterned by deviating the position thereof in the stepwise shape. In this manner, it is possible to effectively use the areas which are not related to the light emission.

According to the aspect of the invention, The method further includes forming the light reflecting layer and the transmissive film for each luminous color, and it may be possible to pattern the transmissive film by deviating the position thereof in the stepwise shape on the same one side in each luminous color, as patterning of the transmissive film by deviating the position thereof in the stepwise shape on at least one side of the rectangle.

In the light emitting device, it is possible to provide the contact hole on the same one side, and it is advantageous when performing the layout, since at least one side of the rectangle on which the transmissive film is patterned by deviating the position thereof in the stepwise shape is the same one side in each luminous color.

BRIEF DESCRIPTION OF THE DRAWINGS

The invention will be described with reference to the accompanying drawings, wherein like numbers reference like elements.

FIG. 11 is a graph which shows a calculation result of an aperture ratio of the light emitting device according to the embodiment.

FIG. 12 is a graph which shows a calculation result of an aperture ratio of the light emitting device of the comparative example.

DESCRIPTION OF EXEMPLARY EMBODIMENTS

Figure 1:
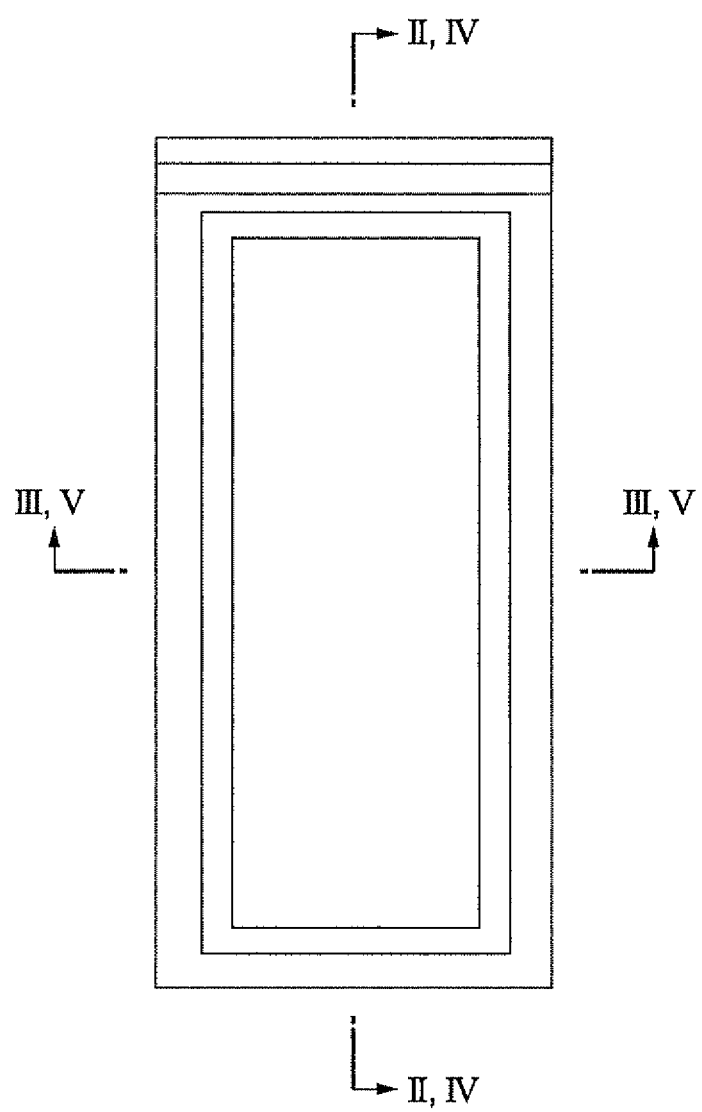
FIG. 1 is a plan view which shows a structure of a red light emitting element in a light emitting device according to an embodiment of the invention.

Hereinafter, various embodiments according to the invention will be described with reference to accompanying drawings. In the drawings, the ratio of the dimension of each portion is appropriately deviated from the real size.

A: Embodiments

A-1: Structure of Light Emitting Device

Figure 2:
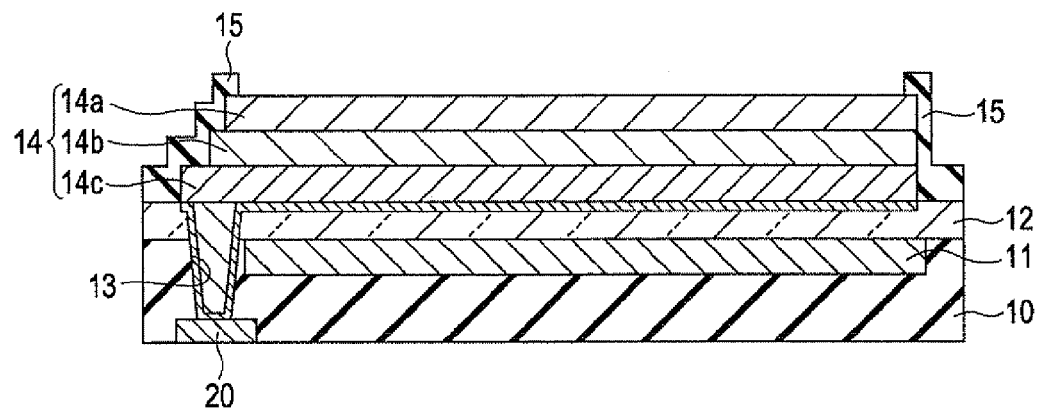
FIG. 2 is a cross-sectional view taken along the direction II-II in FIG. 1.
Figure 3:
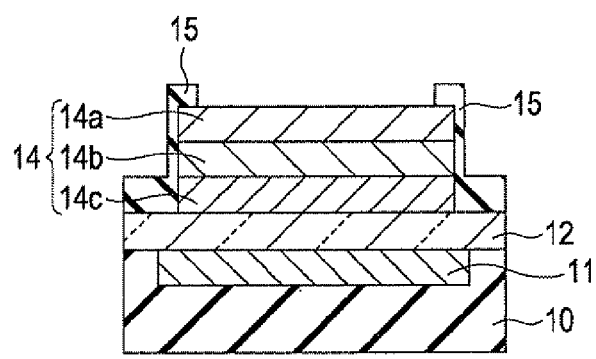
FIG. 3 is a cross-sectional view taken along the direction III-III in FIG. 1.
Figure 4:
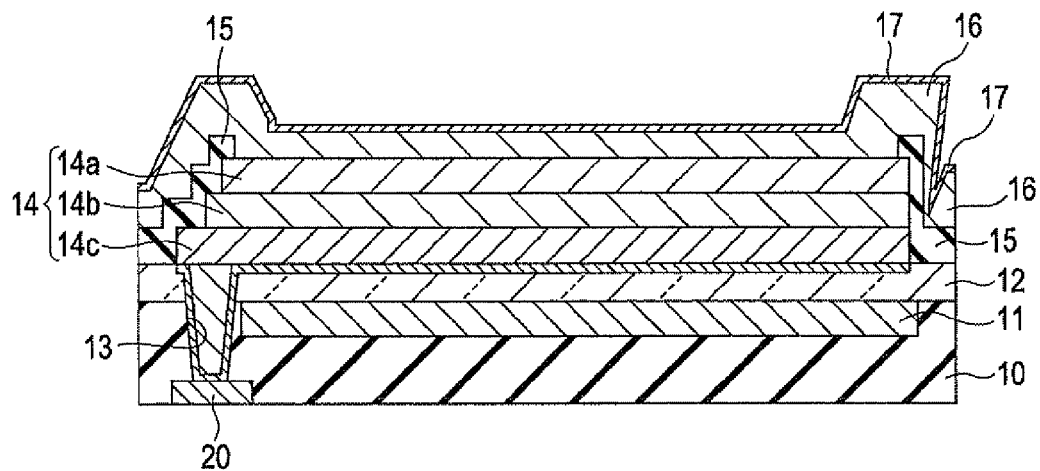
FIG. 4 is a cross-sectional view taken along the direction IV-IV in FIG. 1 in a state where an organic EL element and electrodes on the light extraction side are formed on an insulating layer and electrodes on a substrate side.
Figure 5:
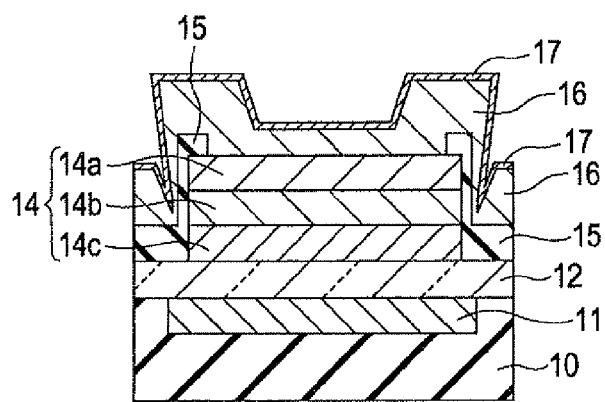
FIG. 5 is a cross-sectional view which is taken along the direction V-V in FIG. 1 in a state where the organic EL element and the electrodes on the light extraction side are formed on the insulating layer and the electrodes on the substrate side.

FIG. 1 is a plan view which shows a structure of a red light emitting element in a light emitting device according to an embodiment of the invention. FIG. 2 is a cross-sectional view taken along the direction II-II in FIG. 1. FIG. 3 is a cross-sectional view taken along the direction III-III in FIG. 1. FIG. 4 is a cross-sectional view taken along the direction in IV-IV in FIG. 1 in a state where an organic EL element and electrodes on the light extraction side are formed on an insulating film and electrodes on a substrate side. FIG. 5 is a cross-sectional view which is taken along the direction V-V in FIG. 1 in a state where the organic EL element and the electrodes on the light extraction side are formed on the insulating layer and the electrodes on the substrate side.

The light emitting device according to the embodiment has a configuration in which light emitting elements are arranged on a substrate which is not shown. Each luminous element is an element which generates light with wavelength corresponding to any of a plurality of colors (red, green, or blue). In the embodiment, a structure of a light emitting element which emits red light will be described in order to make description simple. The light emitting device according to the embodiment is a top emission-type in which light generated in each light emitting element proceeds toward the opposite side of the substrate. Accordingly, it is possible to use opaque plates such as ceramics, metal sheet, or the like, in addition to light transmissive plates such as glass or the like.

A device layer (not shown) in which a TFT which is a driving element, or retentive capacity is formed is provided, and the entire surface of the device layer is flattened using a planarizing film 10 which is formed of $SiO_2$, or SiN. A reflective film 11 is provided inside the surface side of the planarizing film 10. The reflective film 11 is formed of a light reflective material. As such materials, for example, a single metal such as aluminum, silver, or the like, or an alloy which has aluminum or silver as main components or the like are preferably used. A transparent film 12 which is formed of $SiO_2$, or SiN is provided on the planarizing film 10. A wiring 20 which is connected to an electrode of the TFT (Thin Film Transistor) (not shown) is connected to substrate side electrodes 14 through a contact hole 13 which is formed to pass through the planarizing film 10 and the transparent film 12.

The substrate side electrodes 14 are anodes, and are formed on the reflective film 11. The substrate side electrodes 14 are formed of ITO (indium tin oxide), IZO (indium zinc oxide, a registered trade mark of Idemitsu Kosan Co., Ltd.), or a transparent oxide conductive material such as $ZnO_2$. The substrate side electrodes 14 which are formed in the red light emitting element, green light emitting element, and blue light emitting element have different configurations, respectively. The substrate side electrodes 14 which are formed in the red light emitting element which is described in the embodiment are formed of three layers of transparent conductive film of 14a, 14b, and 14c. Even though it is not shown in FIGS. 2 and 3, the substrate side electrodes 14 which are formed in the green light emitting element are formed of two layers of transparent conductive film of 14b, and 14c, and the substrate side electrodes 14 which are formed in the blue light emitting element are formed of one layer of transparent conductive film of 14c. In this manner, according to the embodiment, the resonant length is adjusted on the substrate side, by laminating the transparent conductive films.

An end portion of the substrate side electrodes 14 is covered with an insulating film 15 which is formed of $SiO_2$, or SiN as shown in FIG. 4, and further an organic EL layer 16 is formed thereon. The organic EL layer 16 is formed to cover the substrate side electrodes 14. That is, the organic EL layer 16 is formed to be continuous over a plurality of light emitting elements, and the characteristics of the organic EL layer 16 are common to the plurality of light emitting elements. Even though detailed figures are omitted, the organic EL layer 16 is formed of a hole injection layer which is formed on the substrate side electrodes 14, a hole transport layer which is formed on the hole injection layer, a luminous layer which is formed on the hole transport layer, an electron transport layer which is formed on the luminous layer, and an electron injection layer which is formed on the electron transport layer. In addition, it is possible to form the hole injection layer and the hole transport layer in a single layer which functions both as the hole injection layer and the hole transport layer.

The luminous layer is formed of an organic EL material in which holes and electrons are combined and emit light. According to the embodiment, the organic EL material is a low molecular material. As a host material of the luminous layer, a brand name of "BH-232" which is made by Idemitsu Kosan Co., Ltd. is used, and dopant of red, green, and blue is mixed in the host material. According to the embodiment, as a material of the red dopant, a brand name of "RD-001" made by Idemitsu Kosan Co., Ltd. is used, and as a material of the green dopant, a brand name of "GD-206" made by Idemitsu Kosan Co., Ltd. is used, and as a material of the blue dopant, a brand name of "BD-102" made by Idemitsu Kosan Co., Ltd. is used.

According to the embodiment, the electron transport layer is formed of Alq3 (tris 8 quinolinolato aluminum complex). In addition, the electron injection layer is formed of LiF (lithium fluoride). In addition, it is possible to form the electron injection layer and the electron transport layer in a single layer which functions both as the electron injection layer and the electron transport layer.

A light extraction side electrode 17 which is shown in FIG. 4 is a cathode, and is formed so as to cover the organic EL layer 16. That is, the light extraction side electrode 17 is formed to be continuous over the plurality of light emitting elements. The light extraction side electrode 17 functions as a semi-transmissive reflective layer with a property of transmitting a part of light which reaches the surface thereof, and reflecting a part light other than that (that is, semi-transmissive reflecting layer), and for example, is formed of a single metal such as magnesium, silver, or the like, or an alloy or the like which has magnesium or silver as main components. In the embodiment, the light extraction side electrode 17 is formed of MgAg (magnesium-silver alloy).

In the light emitting device according to the embodiment, a resonator structure which resonates light which is emitted from the organic EL layer 16 between the reflective film 11 and the light extraction side electrode 17 is formed. That is, the light which is emitted from the organic EL layer 16 reciprocates between the reflective film 11 and the light extraction side electrode 17, of which light with specific wavelength is strengthened due to resonance and passes through the light extraction side electrode 17, and proceeds to the observation side (upper parts in FIGS. 2 and 4) (top emission).

The film thickness of the substrate side electrodes 14 in each light emitting element is adjusted so that the red color is strengthened in the red light emitting element in the light emitted in the organic EL layer 16, the green color is strengthened in the green light emitting element, and the blue color is strengthened in the blue light emitting element.

Although it is not shown in FIGS. 1 to 5, a stress relaxation layer is formed so as to cover the light extraction side electrode 17. The stress relaxation layer has light transmittivity and humidity resistance, and is formed of a softer material than the light extraction side electrode 17. The stress relaxation layer is formed of the same material as that of the electron injection layer in the organic EL layer 16, and for example, is formed any one of LiF, $LiO_2$, Liq, MgO, $MgF_2$, $CaF_2$, $SrF_2$, NaF, and WF.

In addition, a passivation layer (not shown) is formed, which is a protective layer for preventing water and ambient air from infiltrating into the light emitting element, and is formed of an inorganic material, on the light extraction side electrode 17. The passivation layer is formed of the inorganic material with low gas permeability such as silicon nitride, silicon oxynitride, or the like.

In addition, according to the embodiment, a second substrate (not shown) is arranged so as to face the plurality of light emitting elements. The second substrate is formed of a material with light transmittivity such as glass, or the like. A color filter and shielding film are formed on a surface of the second substrate which faces the substrate on which the planarizing film 10 is formed. The shielding film is a light shielding film body in which an opening is formed corresponding to each light emitting element. A color filter is formed in the opening.

According to the embodiment, a red color filter which performs selective penetration of red light is formed in the opening which corresponds to the red light emitting element, a green color filter which performs selective penetration of green light is formed in the opening which corresponds to the green light emitting element, and a blue color filter which performs selective penetration of blue light is formed in the opening 36 which corresponds to the blue light emitting element.

The second substrate on which the color filter and the shielding film are formed is bonded to a substrate on which the above described planarizing film 10 is formed through a sealing layer which is not shown. The sealing layer is formed of a transparent resin material, for example, hardening resin such as epoxy resin or the like. Hitherto is the structure of the light emitting device according to the embodiment.

A-2: Patterning of Transparent Conductive Film

Subsequently, the patterning of the transparent conductive film of the substrate side electrodes 14 according to the embodiment will be described. When the transparent conductive film is laminated, and the resonant length thereof is adjusted by the film thickness, a large step difference occurs in the periphery of pixels due to the lamination of the transparent conductive film. If the organic EL layer and the light extraction side electrode are formed in this state, the step breakage occurs after the film formation.

Figure 6:
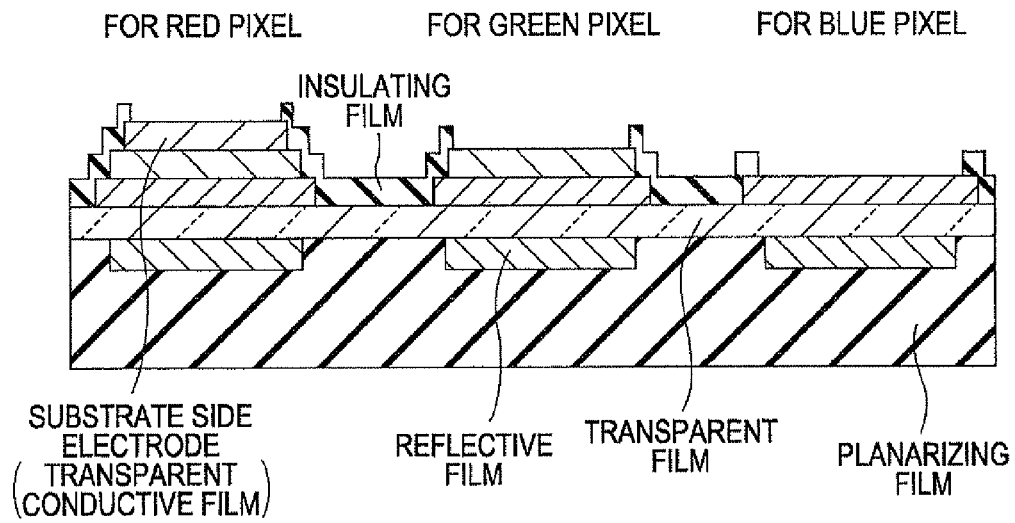
FIG. 6 is a cross-sectional view which shows a structure of a light emitting device as a comparative example.

Therefore, in order to prevent such a step breakage, each of the pattern positions of the transparent conductive film is formed to be deviated in the stepwise shape as shown in FIG. 6. In this manner, the step difference in the periphery of the pixels becomes small, and it is possible to prevent the step breakage after forming the organic EL layer and the light extraction side electrode.

In addition, as described above, when the step difference of the transparent conductive film is exposed, in which the pattern position is formed to be deviated in the stepwise shape, the film thickness of the organic EL layer which is formed on the transparent conductive film becomes thin, and an excessive current flows to the portion. Further, the width of the reflective film is formed to be wider than that of the lowermost transparent conductive film. Light emission with suitable color is performed in a portion where the transparent conductive film in which an appropriate film thickness adjustment is performed is formed to the upper part of the reflective film. However, an undesirable color will be emitted, since the transparent conductive film is not present on the upper part of a portion where the reflective film protrudes to the outside of the lowermost transparent conductive film.

Figure 7:
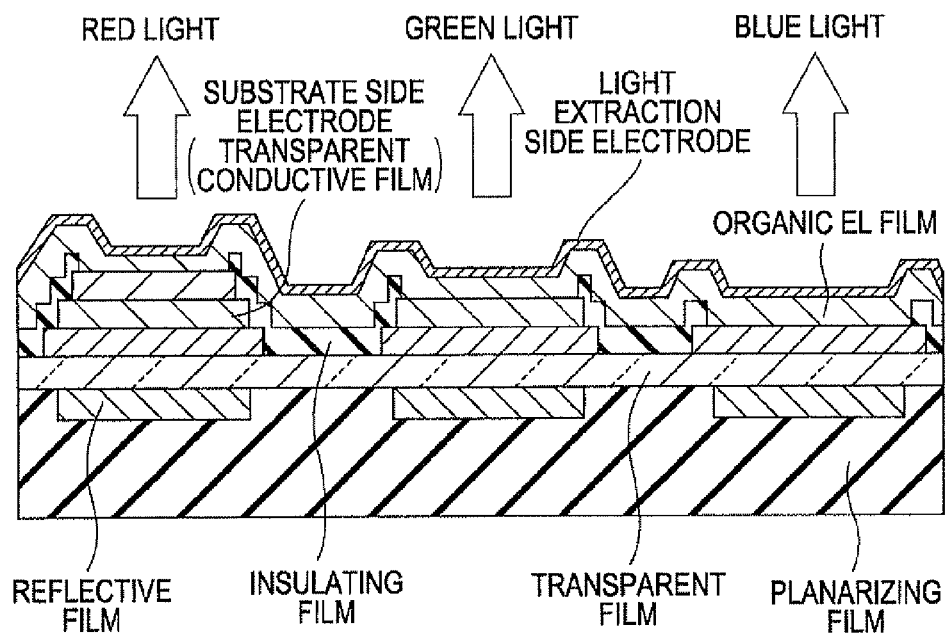
FIG. 7 is a cross-sectional view which shows a state where the organic EL element and the electrodes on the light extraction side are formed in the light emitting device in FIG. 6.

Therefore, an insulating film is provided at the end portion of the transparent conductive film as shown in FIG. 6, in order to cover the portion where the above described step difference of the transparent conductive film is exposed, and to cover the region in the upper part of the reflecting film where the transparent conductive film is not present. In this manner, as shown in FIG. 7, it is possible to form the organic EL layer and the light extraction side electrode without causing the step breakage.

Figure 8:
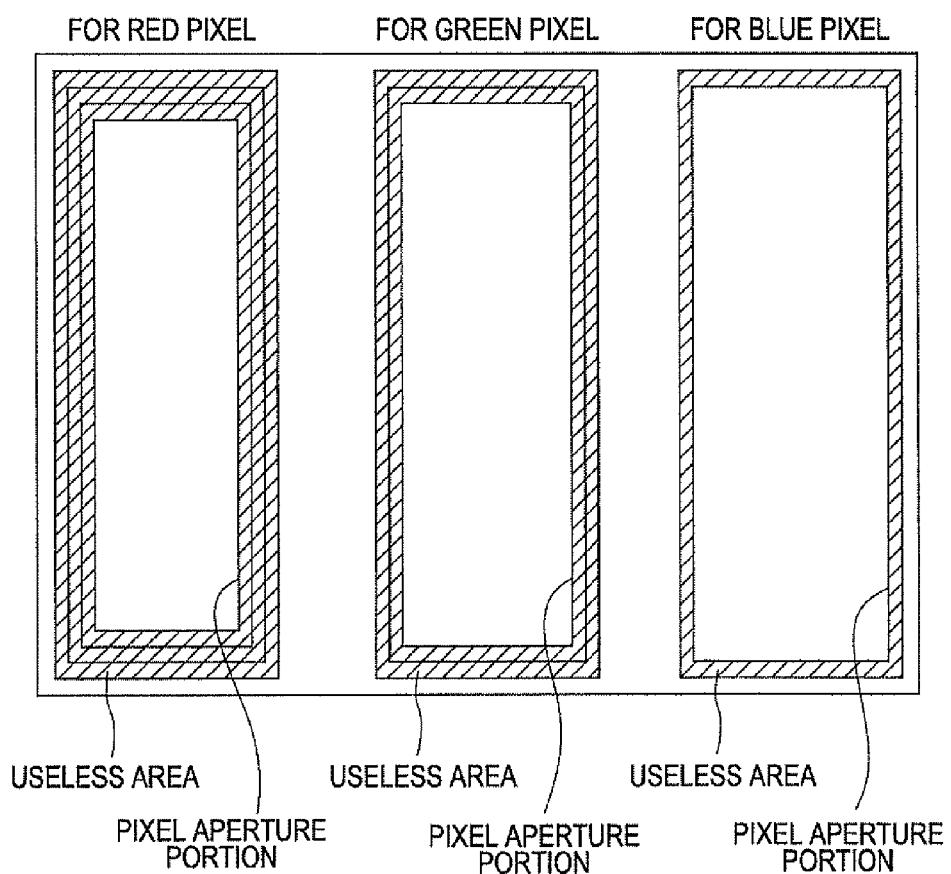
FIG. 8 is a plan view which shows an aperture area of each color of the light emitting device of the comparative example.

However, the region which is covered with the insulating layer in the transparent conductive film of which pattern position is deviated and laminated does not relate to the light emission as shown in FIG. 8, and as a result, the aperture area becomes small.

Accordingly, in the embodiment, as shown in FIGS. 1, 2 and 4, one side of the light emitting element on the short side forms the transparent conductive films 14a, 14b, and 14c by deviating the pattern position of the transparent conductive films 14a, 14b, and 14c in the stepwise shape, and for another side, forms the transparent conductive films 14a, 14b, and 14c in a pattern position where the end surface thereof is to be aligned, as shown in FIGS. 1 to 5. As a result, in at least one side of the light emitting element on the short side, the step difference in the periphery of the pixels becomes small, and it is possible to perform conduction to the organic EL layer 16 and the light extraction side electrode 17, without causing the step breakage. In addition, the end surfaces of the transparent conductive films 14a, 14b, and 14c are aligned in another side, the area of regions not relating to the light emission is reduced, accordingly, it is possible to make the aperture area wide.

In addition, in the light emitting element according to the invention, as shown in FIGS. 2 and 4, it is necessary to form a contact hole 13. However, the contact hole 13 is provided on one side in which the transparent conductive films are formed by deviating the pattern position thereof in the stepwise shape (refer to FIG. 9). Since the region where the transparent conductive films are formed by deviating the pattern position thereof, and the insulating film is formed thereon is originally not a region relating to the light emission, it does not interfere with the light emission even if the contact hole 13 is provided in this region. Further, according to the embodiment, since a region in which the transparent conductive films are formed by deviating the pattern position thereof is provided at one side of the short side on the same side, in each of the red light emitting element, green light emitting element, and blue light emitting element, it is possible to form the contact hole 13 in any of the light emitting elements, accordingly, it is advantageous when performing the layout. In addition, there may be a case where the step difference occurs when forming the contact hole 13, however, as described above, since the transparent conductive films are formed by deviating the pattern position thereof, and the contact hole 13 according to the embodiment is formed in a region where the insulating film is provided, it is possible to prevent current concentration.

A-3: Improving Aperture Ratio

Figure 9:
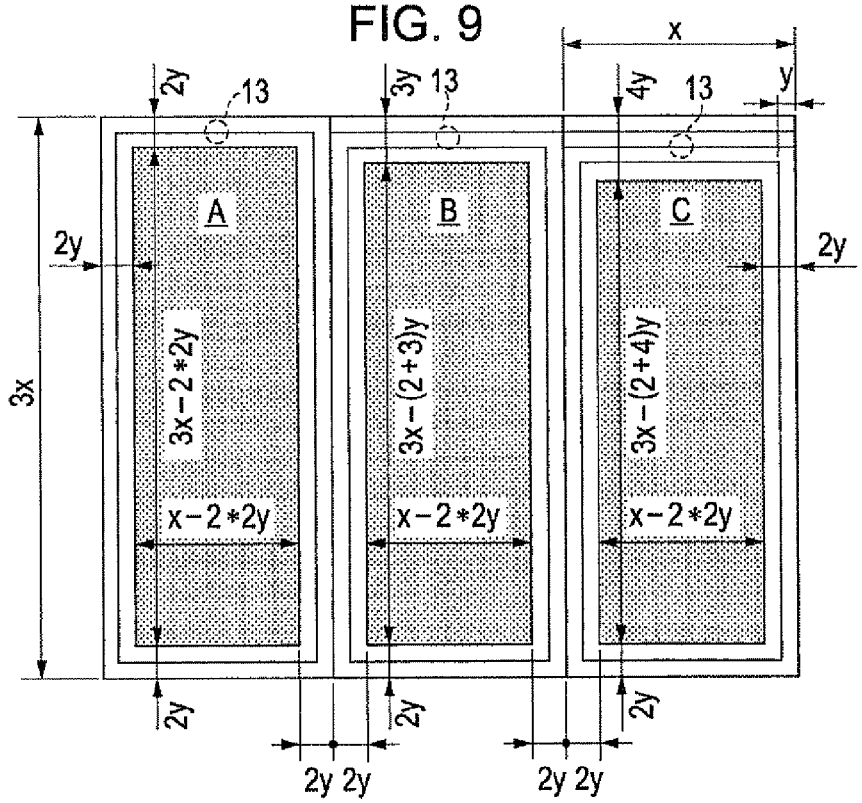
FIG. 9 is a plan view which shows the aperture area of each color of the light emitting device according to the embodiment.

Subsequently, in the embodiment, the degree to which the aperture ratio has improved will be described. FIG. 9 is an example of the light emitting device according to the embodiment. That is, in each of the red light emitting element, green light emitting element, and blue light emitting element, the transparent conductive films are formed by deviating the pattern position thereof on the one side of the short side on the same side, and the transparent conductive films are formed in the pattern position in which the end surface is aligned on other sides. On the other hand, FIG. 10 is an example, as shown in FIGS. 6 to 8, in which the transparent conductive films are formed by deviating the pattern position thereof in each side of the red light emitting element, green light emitting element, and blue light emitting element.

Figure 10:
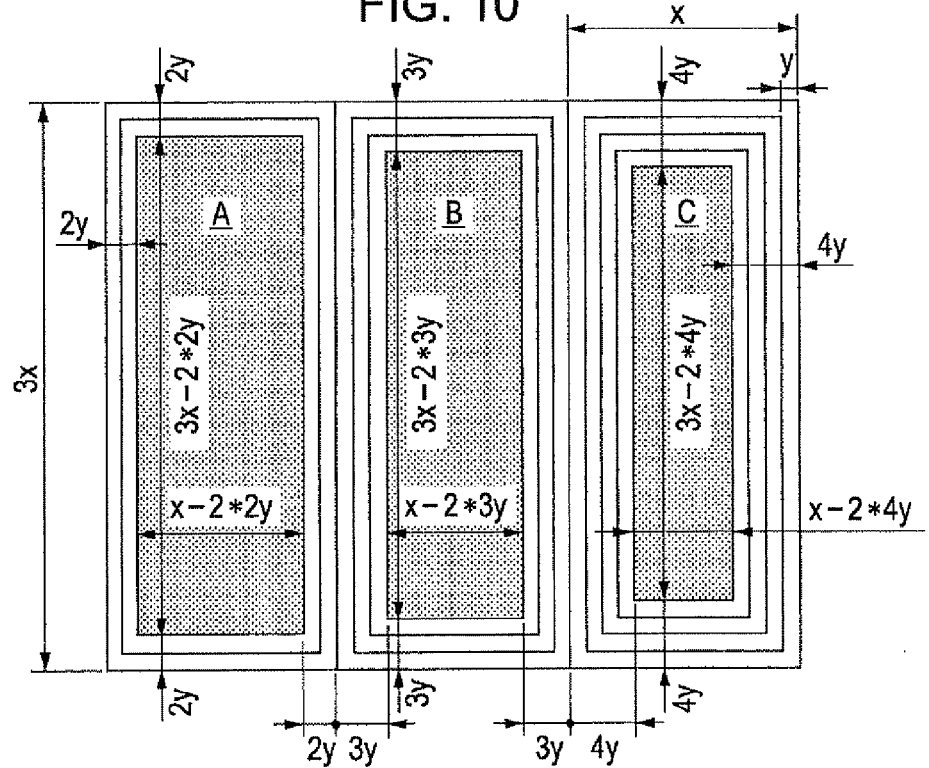
FIG. 10 is a plan view which shows the aperture area of each color of the light emitting device of the comparative example.

In order to simplify description, the region of the contact hole is not considered in FIGS. 9 and 10. In order to calculate the pixel aperture ratio, it is defined that the width of one pixel is 3x, the sub-pixel pitch is x, and the minimum feature size is y. Each of areas of the openings is as follows.

In the case of FIG. 9 (the embodiment)

area of $A$: $SA=(x-2*2y)(3x-2*2y)$ area of $B$: $SB=(x-2*2y)(3x-(2+3)y)$ area of $C$: $SC=(x-2*2y)(3x-(2+4)y)$ (however, $x>2*4y$)

In the case of FIG. 10 (a comparative example)

area of $A$: $SA=(x-2*2y)(3x-2*2y)$ area of $B$: $SB=(x-2*3y)(3x-2*3y)$ area of $C$: $SC=(x-2*4y)(3x-2*4y)$ (however, $x>2*4y$)

A calculation result of the aperture ratio $((SA+SB+SC)/3x^2)$ which is calculated by changing the range of sub-pixel pitch x from 1 to 5 μm, and the minimum feature size y from 0.1 to 0.5 μm is shown in graphs of FIGS. 11 and 12. FIG. 11 corresponds to the case in FIG. 9 (the embodiment), and FIG. 12 corresponds to the case in FIG. 10 (the comparative example).

It is understood that the aperture ratio in the embodiment is wide, as becomes clear when comparing FIG. 11 and FIG. 12. For example, when it is defined that the sub-pixel pitch x is 3.0 μm, the minimum feature size is 0.2 μm, the aperture ratio is 65.19% according to the embodiment, and there is a difference of equal to or greater than 10%, compared to the aperture ratio of 52.40% in the comparative example.

As describe above, according to the embodiment, the one side of the short side on the same side was formed with the transparent conductive films of which the pattern position is deviated in the stepwise shape, in each of the red light emitting element, green light emitting element, and blue light emitting element. As a result, is possible to prevent the current from excessively flowing to the organic EL layer, by reducing the step difference of the transparent conductive films. In addition, since the step difference is small, it is possible to secure the conduction with respect to the organic EL layer and the light extraction side electrode, without causing the step breakage of the organic EL layer and the light extraction side electrode. In addition, since the end surfaces of the transparent conductive films are formed to be aligned in the pattern position, in sides other than the one side of the short side, it is possible to make the aperture area wide, and to increase the aperture ratio. Accordingly, it is possible to make the luminance lifetime of the organic EL layer longer.

B: Application Example

Figure 13:
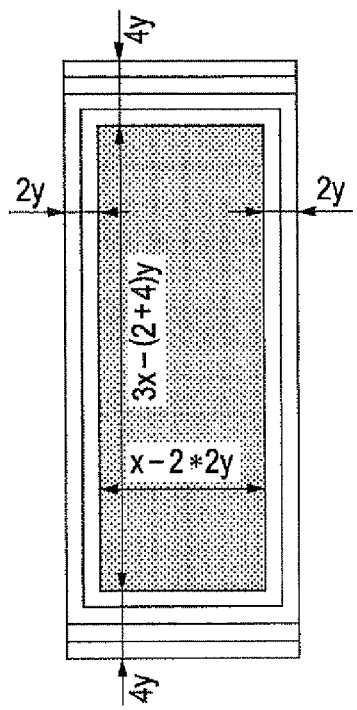
FIG. 13 is a plan view which shows a structure of the red light emitting element of a light emitting device according to an application example of the invention.

FIG. 13 is a diagram which shows a structure of a light emitting device of an application example according to the embodiment of the invention. As shown in FIG. 13, transparent conductive films may be formed in a stepwise shape by deviating a pattern position on both short sides of the light emitting element, and formed in a pattern position where the end surface is aligned in other sides.

In a high definition organic EL display in which the minimum feature size and pixel pitch of the light emitting element are similar to each other, the panel size is also small, and for example, is equal to or smaller than 1 inch. Accordingly, the resistance value for the light extraction side electrode is enough with the resistance value of metal film of about 10 nm, and for example, is 10 to 50Ω/□. For this reason, it is considered that an auxiliary wiring is not necessary. However, in the above described light emitting device according to the embodiment, the conduction to the light extraction side electrode is secured in the region where the transparent conductive films are formed in the stepwise shape, however, the conduction is not secured in a region of the short side which faces the region. Accordingly, it is necessary to provide a thin wire in a small region on the long side with respect to the light extraction side electrode in the region where the conduction is not secure, accordingly the resistance value increases. As a result, display unevenness may occur.

Accordingly, in the application example, the transparent conductive films are formed in a stepwise shape on both short sides of the light emitting element by deviating the pattern position, and on another sides, the transparent conductive films are formed in the pattern position where the end surface is aligned. In this manner, it is possible to secure the conduction to the light extraction side electrode on both the short sides without extremely reducing the aperture area. As a result, it is possible to apply the embodiment of the invention to the high definition organic EL display such as EVF (Electric View Finder), HMD (Head Mount Display), or the like.

In addition, in the above described embodiment and the application example, an example is described in which the resonant length is adjusted using the film thickness of the transparent conductive films of the substrate side electrode, however, it is not limited to the invention. The resonant length may be adjusted by the film thickness of the transparent film which is formed as an underlying layer of the transparent conductive films.

C. Electronic Apparatus

Figure 14:
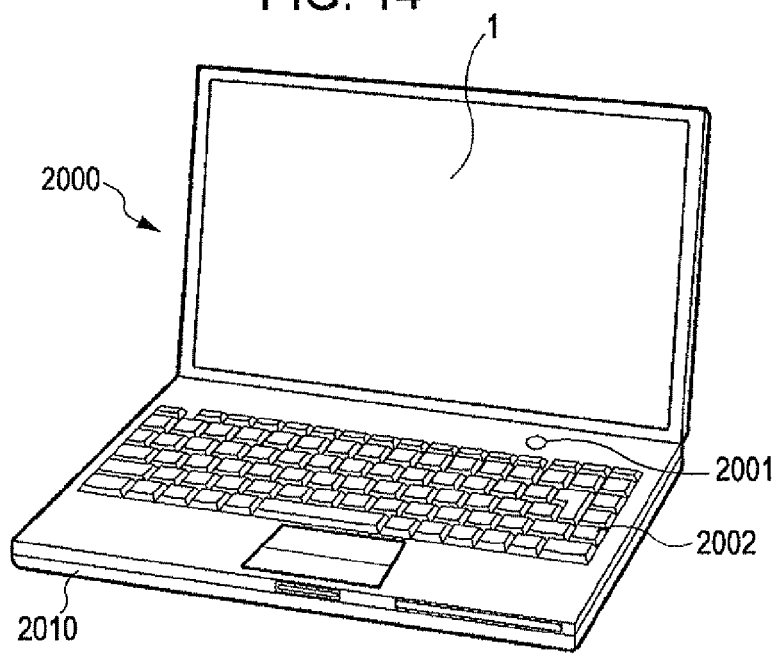
FIG. 14 is a perspective view which shows an example of an electronic apparatus in which the light emitting device according to the embodiment is used.

Subsequently, electronic apparatuses to which the light emitting device 1 relating to the above described embodiment and the application example are applied will be described. FIG. 14 shows a configuration of a mobile-type personal computer to which the emitting device 1 is applied. A personal computer 2000 includes the light emitting device 1 as a display unit, and a main body 2010. A power switch 2001 and a keyboard 2002 are provided in the main body 2010.

Figure 15:
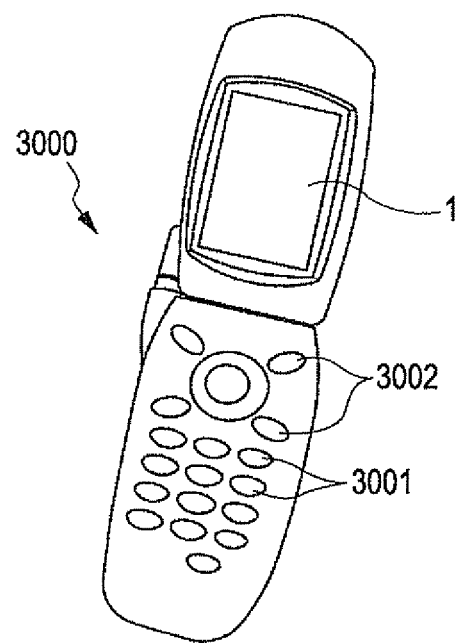
FIG. 15 is a perspective view which shows an example of an electronic apparatus in which the light emitting device according to the embodiment is used.

FIG. 15 shows a configuration of a mobile phone to which the light emitting device 1 is applied. A mobile phone 3000 includes a plurality of operation buttons 3001 and scroll buttons 3002, and the light emitting device 1 as a display unit. By operating the scroll buttons 3002, a screen which is displayed in the light emitting device 1 is scrolled.

Figure 16:
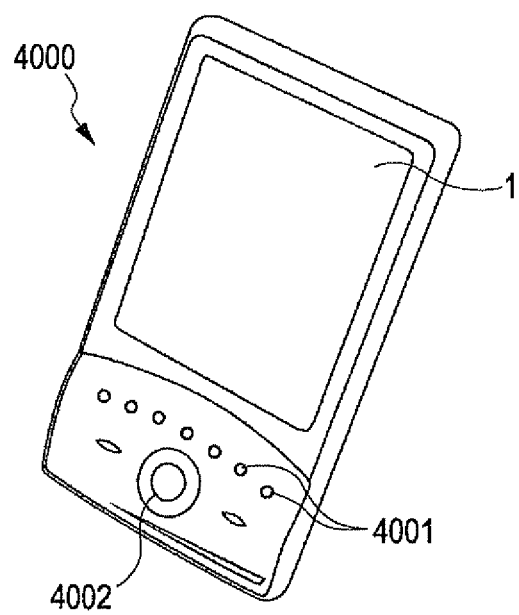
FIG. 16 is a perspective view which shows an example of an electronic apparatus in which the light emitting device according to the embodiment is used.

FIG. 16 shows a configuration of a PVA (Personal Vigital Assistants) to which the light emitting device 1 is applied. A PVA 4000 includes a plurality of operation buttons 4001 and a power switch 4002, and the light emitting device 1 as a display unit. By operating the power switch 4002, a variety of information such as an address book, or a diary is displayed on the light emitting device 1.

In addition, as an electronic apparatus to which the light emitting device 1 is applied, there are a digital still camera, a liquid crystal TV, a video tape recorder of a viewfinder type, or of a direct-view monitor type, a car navigation system, a pager, an electronic organizer, a calculator, a word processor, a workstation, a TV phone, a POS terminal, a device with a touch panel, electronic paper, or the like, in addition to the apparatuses shown in FIGS. 14 to 16. In addition, as a display unit of these various electronic apparatuses, the above described light emitting device may be adopted.

This application claims priority from Japanese Patent Application No. 2011-049406 filed in the Japanese patent office on Mar. 7, 2011, the entire disclosure of which is hereby incorporated by reference in its entirely.

What is claimed is:

1. A light emitting device comprising:
   a substrate;
   a light reflecting layer which is formed above the substrate;
   a transmissive film which is formed on or above the light reflecting layer;
   a luminous layer which is formed above the transmissive film;
   an electrode which is formed above the luminous layer;
   a resonant structure in which an optical path length between the light reflecting layer and the electrode is adjusted by the transmissive film; and
   a rectangular aperture area,
   wherein the transmissive film includes a plurality of discrete layers; and wherein the transmissive film layers are patterned so that at least one edge of the transmissive film has a stepwise shape with steps formed as successive layers of the transmissive film, and so that another edge of the transmissive film formed by the successive layers is flush.

2. The light emitting device according to claim 1, wherein an end portion of the transmissive film is covered with an insulating layer.

3. The light emitting device according to claim 1, wherein on the one side of the transmissive film with a stepwise shape edge, a driving element which is provided on the substrate side and the electrode are electrically connected to each other.

4. The light emitting device according to claim 1, wherein on a side of the transmissive film with a flush edge, a driving element which is provided on the substrate side is not electrically connected to the electrode.

5. The light emitting device according to claim 1, wherein the transmissive film is a transparent conductive film.

6. The light emitting device according to claim 1, wherein the transmissive film is an insulator.

7. The light emitting device according to claim 1, wherein a contact hole which causes the transmissive film and a driving element to be electrically connected to each other is formed on a side of the transmissive film with the stepwise shape edge.

8. A method of manufacturing a light emitting device comprising:
   forming a light reflecting layer above a substrate;
   forming a transmissive film on or above the light reflecting layer;
   forming a luminous layer above the transmissive film; and
   forming an electrode above the luminous layer,
   wherein the light emitting device includes a resonant structure in which an optical path length between the light reflecting layer and the electrode is adjusted by the transmissive film, and is formed with a rectangular aperture area, and
   wherein the method includes,
   patterning successive layers of the transmissive film in a stepwise shape on at least one side of the rectangle; and
   patterning the successive layers of the transmissive film so that the successive layers are flush at another side of the rectangle.

* * * * *